(12) United States Patent
Choi et al.

(10) Patent No.: US 7,643,368 B2
(45) Date of Patent: Jan. 5, 2010

(54) POWER CONTROL CIRCUIT FOR SEMICONDUCTOR IC

(75) Inventors: Chang-Jun Choi, Hwaseong-si (KR); Suhwan Kim, Gwanak-gu (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 30 days.

(21) Appl. No.: 11/969,968

(22) Filed: Jan. 7, 2008

(65) Prior Publication Data

US 2008/0165608 A1    Jul. 10, 2008

(30) Foreign Application Priority Data

Jan. 8, 2007    (KR) ...................... 10-2007-0002112

(51) Int. Cl.
   *G11C 5/14*    (2006.01)
(52) U.S. Cl. ...................... 365/227; 365/226; 365/228; 365/229
(58) Field of Classification Search ................. 365/227, 365/226, 228, 229
   See application file for complete search history.

(56) References Cited

U.S. PATENT DOCUMENTS

| | | | | |
|---|---|---|---|---|
| 3,859,638 A | * | 1/1975 | Hume, Jr. | 365/229 |
| 5,172,341 A | * | 12/1992 | Amin | 365/222 |
| 5,262,999 A | * | 11/1993 | Etoh et al. | 365/226 |
| 5,710,931 A | * | 1/1998 | Nakamura et al. | 713/323 |
| 5,726,946 A | * | 3/1998 | Yamagata et al. | 365/226 |
| 5,898,577 A | * | 4/1999 | Tomiyama | 363/19 |
| 6,288,963 B1 | * | 9/2001 | Kato | 365/222 |
| 6,335,895 B1 | * | 1/2002 | Sugibayashi | 365/227 |
| 6,452,854 B1 | * | 9/2002 | Kato et al. | 365/226 |
| 6,628,554 B2 | * | 9/2003 | Hidaka | 365/189.09 |
| 6,745,138 B2 | * | 6/2004 | Przydatek et al. | 702/61 |
| 6,865,690 B2 | * | 3/2005 | Kocin | 714/14 |
| 6,996,007 B2 | * | 2/2006 | Ahn et al. | 365/185.08 |
| 7,023,058 B2 | * | 4/2006 | Kanno et al. | 257/371 |
| 7,054,201 B2 | * | 5/2006 | Ahn et al. | 365/185.28 |
| 7,227,804 B1 | * | 6/2007 | Kothandaraman et al. | 365/229 |
| 7,348,804 B2 | * | 3/2008 | Hoberman et al. | 326/82 |

FOREIGN PATENT DOCUMENTS

| | | |
|---|---|---|
| JP | 2004208142 A | 7/2004 |
| JP | 2006042304 A | 2/2006 |
| KR | 100142956 B1 | 4/1998 |
| KR | 1020030028467 A | 4/2003 |
| WO | 0186815 A2 | 11/2001 |

* cited by examiner

Primary Examiner—Viet Q Nguyen
(74) Attorney, Agent, or Firm—Volentine & Whitt, PLLC

(57) ABSTRACT

A power control circuit and related method providing power to an output terminal supplying a logic block within a semiconductor integrated circuit are disclosed. The power control circuit includes a power gating circuit providing a main power voltage to the output terminal during a normal operating mode and providing a retention voltage to the output terminal during a data retention mode characterized by the absence of the main power voltage from the logic block, wherein the retention voltage is minimally sufficient to retain data stored in the logic block during the data retention mode.

13 Claims, 5 Drawing Sheets

Fig. 5

| | D1 | D2 | Operating Pump |
|---|---|---|---|
| Max Mode | 0 | 0 | Weak Pump + Strong Pump |
| Weak Mode | 0 | 1 | Weak Pump |
| Strong Mode | 1 | 0 | Strong Pump |
| Stop Mode | 1 | 1 | All Inactive |

POWER CONTROL CIRCUIT FOR SEMICONDUCTOR IC

CROSS-REFERENCE TO RELATED APPLICATIONS

This U.S. non-provisional patent application claims priority under 35 U.S.C. § 119 to Korean Patent Application No. 10-2007-0002112 filed on Jan. 8, 2007, the subject matter of which is hereby incorporated by reference.

BACKGROUND OF THE INVENTION

1. Field of the Invention

The present invention relates to a type of semiconductor integrated circuits (ICs) generally referred as a system-on-chip (SOC). More particularly, the invention relates to a power control circuit for a SOC.

2. Description of the Related Art

As contemporary semiconductor ICs are scaled down to nanometer sized dimensions, difficulties with power leakage for constituent circuits increase. The incorporation of such ICs into portable electronic devices generally running from batteries power supplies only increases the demand for very low loss power supply systems and circuits. Many different approaches have been taken to the reduction of current leakage in such systems and circuits. The use of various control methods, power gating schemes, and retention flip-flops are ready examples of these approaches.

Power gating schemes are generally useful in the reduction of current leakage. These schemes interrupt the application of power to circuit blocks current unused in a SOC. However, where volatile memory devices are incorporated into circuit blocks, the interruption of power will cause a loss of stored data. Thus, in order to retain vital data, it must be backed up prior to power interruption, and thereafter recovered upon re-application of power. Unfortunately, data backup and recovery operations tend to markedly slow the overall operation of a SOC.

In order to avoid burdensome data backup and recovery operations, retention flip-flops have been used in certain designs. As their name suggests, retention flip-flops retain stored data without the application of power. This capability is enabled by very small amount of leakage current associated with retention flip-flops. While the use of retention flip-flops allows data backup and recovery operations to be dispensed with, retention flip-flops also occupy a larger amount of IC surface area, as compared with conventional flip-flops. Thus, as the number of retention flip-flops incorporated into a system design increases, the overall IC chip size tends to undesirably increase.

Therefore, an alternate power control approach is required that allows retention of stored data without unduly expanding the size of a SOC.

SUMMARY OF THE INVENTION

In one embodiment, the invention provides a power control circuit providing power to an output terminal supplying a logic block within a semiconductor integrated circuit, and comprising; a power gating circuit providing a main power voltage to the output terminal during a normal operating mode and providing a retention voltage to the output terminal during a data retention mode characterized by the absence of the main power voltage from the logic block, wherein the retention voltage is minimally sufficient to retain data stored in the logic block during the data retention mode.

In one related aspect, the data retention circuit comprises a switch responsive to the second control signal and the main power voltage, and a charge pump response to a charge pump control signal and the main power voltage to pump up a voltage apparent at the output terminal, and the controller comprises; a power controller receiving the command and generating the first and second control signals, a retention voltage generator generating the retention voltage, a first oscillator receiving the retention voltage and generating a corresponding reference frequency, a second oscillator receiving an actual voltage apparent at the output terminal and generating a corresponding output frequency, and a frequency comparator receiving the reference frequency and the output frequency and generating the charge pump control signal in relation to the comparison.

In another related aspect, the data retention circuit comprises a switch responsive to the second control signal and the main power voltage, and a plurality of charge pumps respectively response to a corresponding plurality of charge pump control signals and the main power voltage to pump up a voltage apparent at the output terminal, and the controller comprises; a power controller receiving the command and generating the first and second control signals, a retention voltage decider generating an indication signal associated with the retention voltage, an output voltage detector generating an indication signal associated with the voltage apparent at the output terminal, and a charge pump controller responsive to the indication signals received from the retention voltage decider and the retention voltage and generating the plurality of charge pump control signals.

In yet another related aspect, the data retention circuit comprises a switch responsive to the second control signal and the main power voltage, and dual weak/strong charge pumps respectively response to first and second charge pump control signals and the main power voltage to pump up a voltage apparent at the output terminal, and the controller comprises; a power controller receiving the command and generating the first and second control signals, a retention voltage decider generating an indication signal associated with the retention voltage, a retention voltage generator responsive to the indication signal associated with the retention voltage to generate the retention voltage, a voltage comparator comparing the retention voltage and the voltage apparent at the output terminal to generate a stop signal, a charge pump controller responsive to the retention voltage and the stop signal to generate the first and second charge pump control signals.

In another embodiment, the invention provides a method of operating a power control circuit providing power to an output terminal supplying a logic block within a semiconductor integrated circuit, the method comprising; in response to a received command, either providing a main power voltage to the output terminal during a normal operating mode or providing a retention voltage to the output terminal during a data retention mode characterized by the absence of the main power voltage from the logic block, wherein the retention voltage is minimally sufficient to retain data stored in the logic block during the data retention mode.

BRIEF DESCRIPTION OF THE DRAWINGS

FIG. 5 is a table summarizing the operational state of the charge pump shown in FIG. 4.

DESCRIPTION OF EMBODIMENTS

Embodiments of the invention will now be described in some additional detail with reference to the accompanying drawings. The invention may, however, be embodied in different forms and should not be constructed as being limited to only the illustrated embodiments. Rather, the illustrated embodiments are presented as teaching examples.

Figure 1:
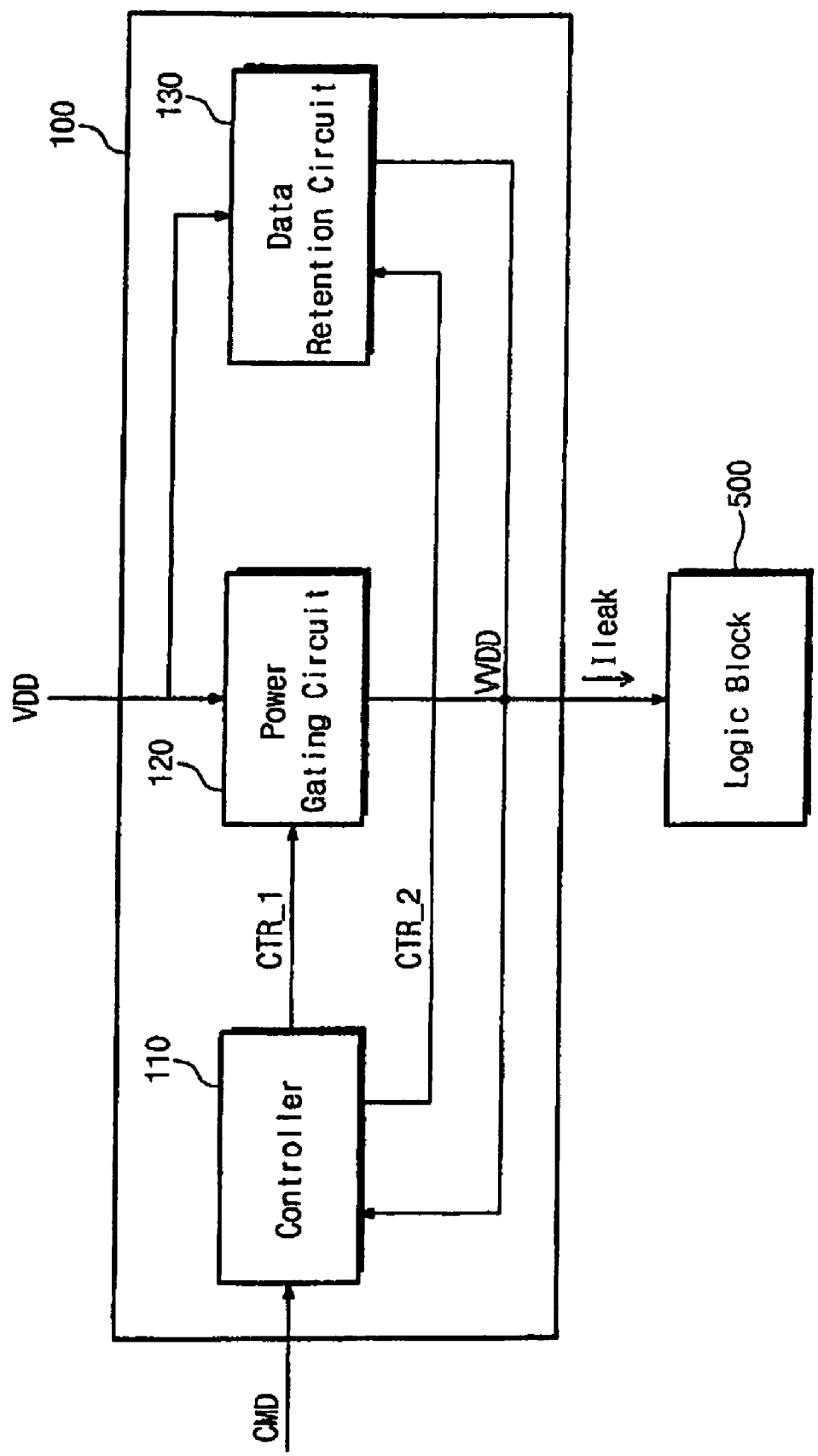
FIG. 1 is a partial block diagram of semiconductor IC accordance to an embodiment of the invention.

FIG. 1 is a block diagram of power control circuit according to an embodiment of the present invention.

Referring to FIG. 1, a power control circuit 100 generally comprises a controller 110, a power gating circuit 120, and a data retention circuit 130.

Power gating circuit 120 supplies or interrupts a "main supply voltage" to a generic logic block 500. In the illustrated examples that follow, it is assumed that the main supply voltage being provided to a logic block is an externally provided voltage VDD. While this provision is common in contemporary semiconductor ICs it is not limiting to the invention which may provide any reasonably defined "main supply voltage". In a defined data retention mode, data retention circuit 130 maintains the voltage apparent at output terminal VVDD at a retention voltage level Vret. In one embodiment, power control circuit 100 enters the data retention mode when the supply of external power VDD to logic block 500 fails.

Controller 110 controls the operation of power gating circuit 120 and data retention circuit 130 in response to an externally provided command CMD and in response to the voltage apparent at output terminal VVDD. In one embodiment, the externally provided command CMD may be any competent command indicated by an acceptable protocol. For example, the externally provided command CMD may indicate normal operation of logic block 500 or transition to the data retention mode, etc.

In FIG. 1, power gating circuit 120 supplies the external power VDD to logic block 500 during normal operation, but not during the data retention mode. The process of supplying the external voltage VDD to logic block 500 via power gating circuit 120 is controlled by a first control signal CTR_1 provided by controller 110.

In the alternative, data retention circuit 130 maintains the voltage apparent at the output terminal VVDD at the retention voltage Vret during data retention mode, such that data stored in logic block 500 is not lost when the supply of external power VDD to logic block 500 is interrupted. In one embodiment, the retention voltage Vret is a voltage minimally sufficiently to prevent the loss of stored data in logic block 500. The term "minimally sufficient" in not intended to define some narrow specific value. Rather, the term is intended to denote a range of practical voltages capable of both retaining stored data in the logic block while substantially reducing the power consumption cause by application of the main supply voltage. The process of supplying the retention voltage Vret to logic block 500 via data retention circuit 130 is controlled by a second control signal CTR_2 provided by controller 110. In this manner, controller 110 switches between activation of data retention circuit 130 and power gating circuit 120 to supply logic block 500 with either the retention voltage Vret or external voltage VDD.

The consistent application of a voltage (either retention voltage Vret or external voltage VDD) sufficiently high enough to avoid loss of stored data in logic block 500 allows a host device incorporating power control circuit 100 to avoid the use of data backup and recovery operations, while reducing overall power consumption.

Figure 2:
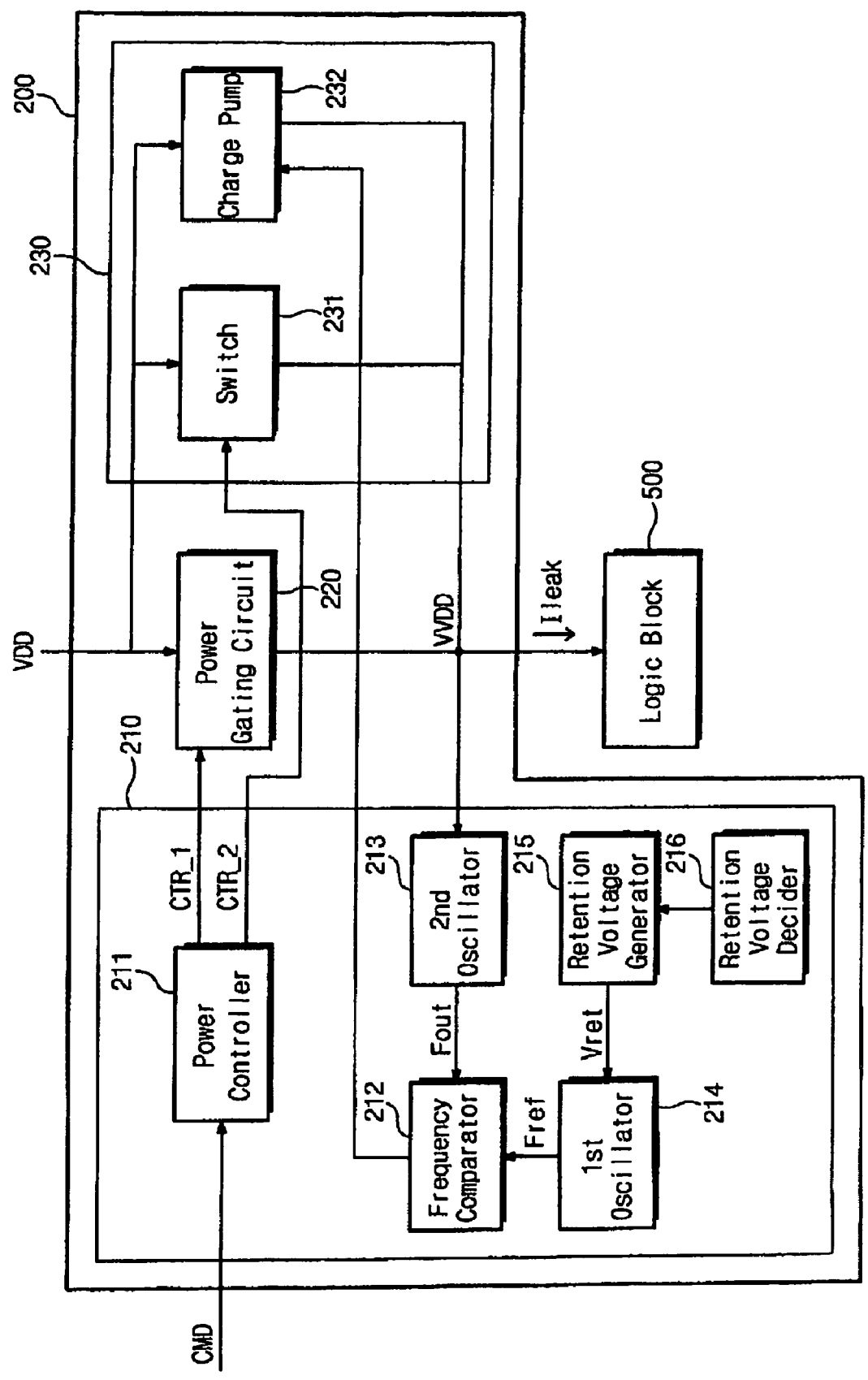
FIG. 2 is a block diagram of a power control circuit for use within a semiconductor IC according to an embodiment of the invention.

FIG. 2 is a block diagram of a power control circuit according to another embodiment of the invention.

Referring to FIG. 2, power control circuit 200 comprises a controller 210, a power gating circuit 220, and a data retention circuit 230. Controller 210 comprises a power controller 211, a retention voltage decider 216, a retention voltage generator 215, a first oscillator 214, a frequency comparator 212, and a second oscillator 213.

Data retention circuit 230 comprises a switch 231 and a charge pump 232.

Within power control circuit 200, power controller 211 operates to control power gating circuit 220 in response to an externally provided command CMD. Power gating circuit 220 supplies or interrupts the application of external power VDD to logic block 500 in response to first control signal CTR_1 provided from power controller 211. Data retention circuit 230 fixes a voltage apparent at the output terminal VVDD to the retention voltage Vret to ensure the integrity of data stored in logic block 500 during the data retention mode.

Retention voltage decider 216 includes flip-flops (not shown). These flip-flops may be same type of device used to store data in logic block 500. Thus, by monitoring the operational state of the flip-flops in retention voltage decider 216 the minimal level of the retention voltage Vret may be accurately determined. In this manner, a proper retention voltage Vret may be applied to the data storing flip-flops of logic block 500.

Retention voltage generator 215 generates the retention voltage Vret in response to a signal received from retention voltage decider 216. First oscillator 214 generates a reference frequency Fref in response to the retention voltage Vret provided from retention voltage generator 215. Second oscillator 213 generates an output frequency Fout in response to the voltage apparent at the output terminal VVDD. A frequency comparator 212 operates to compare the output frequency Fout with the reference frequency Fref, and generate a charge pump control signal applied to charge pump 232 of data retention circuit 230 in accordance with the result of the comparison. For instance, frequency comparator 212 may enable charge pump 232 to charge pump (or "pump up") the voltage apparent at the output terminal when the reference frequency Fref is higher than the output frequency Fout, but may disable charge pump 232 when the reference frequency Fref is lower than the output frequency Fout. Thereby, the voltage apparent at the output terminal Vout may be maintained at the retention voltage Vret.

When power controller 211 receives an externally provided command CMD indicating entry into the data retention mode while power control circuit 200 is currently operating in normal mode, switch 231 of data retention circuit 230 is turned ON to equalize a voltage apparent at the output terminal VVDD with the external power VDD. Then, power controller 211 applies the second control signal CTR_2 to power gating circuit 220, interrupting the application of the external power VDD to logic block 500. As a result, the voltage apparent at the output terminal VVDD decreases according to the leakage current lleak flowing from power control circuit 200 to logic block 500. Controller 210 enables charge pump 232 when the voltage apparent at the output terminal VVDD falls below the retention voltage Vret in order to maintain the voltage apparent at the output terminal VVDD at least at the retention voltage Vret, thereby ensuring the retention of data stored in logic block 500.

Figure 3:
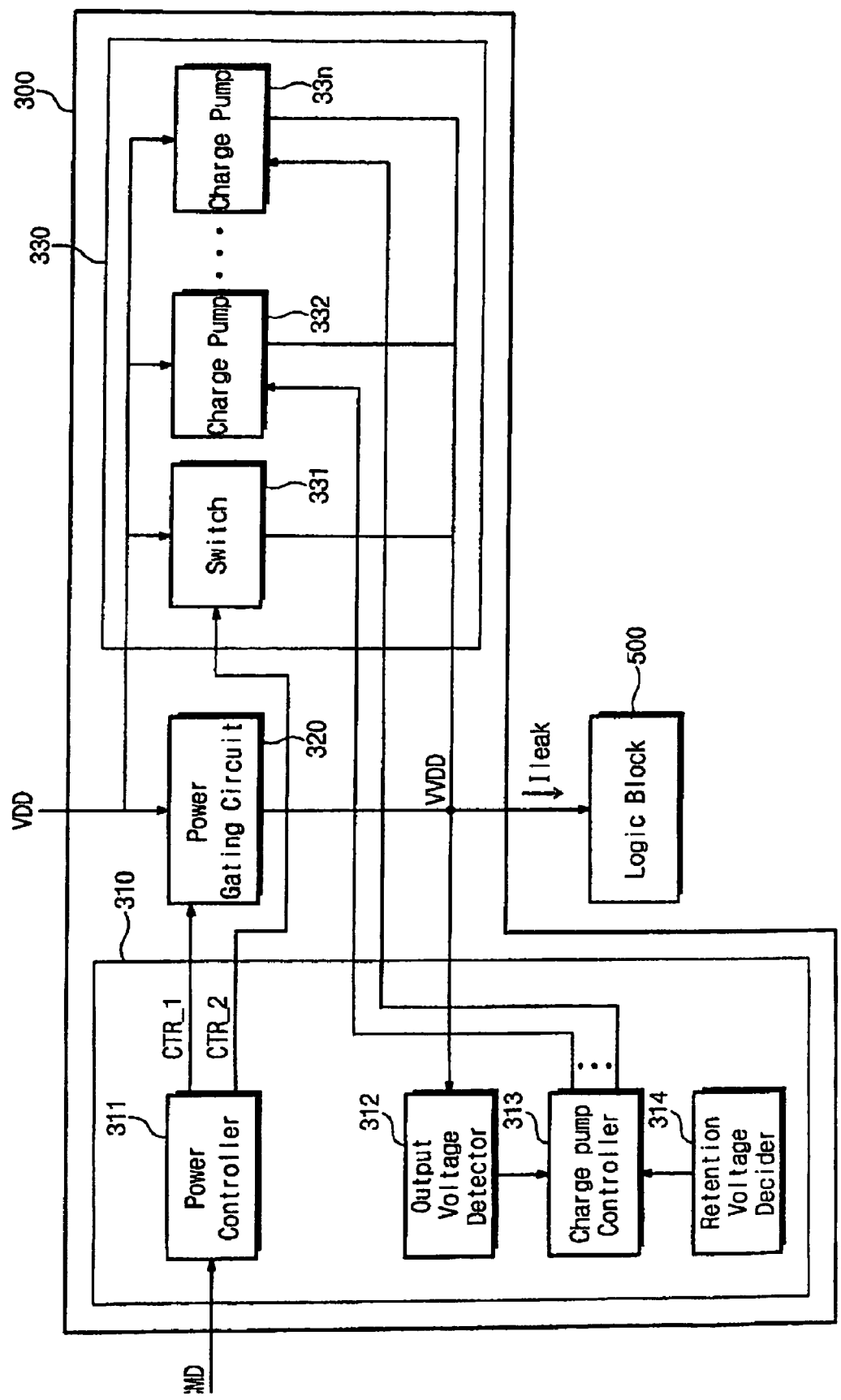
FIG. 3 is a block diagram of a power control circuit for use within a semiconductor IC according to another embodiment of the invention.

FIG. 3 is a block diagram illustrating a power control circuit according to another embodiment of the invention.

Referring to FIG. 3, power control circuit 300 comprises a controller 310, a power gating circuit 320, and a data retention circuit 330. Controller 310 comprises a power controller 311, a retention voltage decider 314, a charge pump controller 313, and an output voltage detector 312.

Data retention circuit 330 comprises a switch 331 and a plurality of charge pumps 332~33n.

Power controller 311 operates to control power gating circuit 320 in response to an externally provided command CMD. Power gating circuit 320 supplies or interrupts the application of external power VDD to logic block 500 in response to a first control signal CTR_1 provided from power controller 311. Data retention circuit 330 fixes the voltage apparent at the output terminal VVDD to the retention voltage Vret to prevent loss of stored data from logic block 500 during data retention mode when the supply of external power VDD is interrupted.

Retention voltage decider 314 operates like retention voltage decider 216 above.

An indication signal corresponding to the retention voltage Vret provided by retention voltage decider 314 is applied to charge pump controller 313. Further, the voltage apparent at the output terminal VVDD, as detected by output voltage detector 312, is applied to charge pump controller 313. Charge pump controller 313 generates respective charge pump control signals and applied same to the plurality of charge pumps 332~33n in response to the signals provided by retention voltage decider 314 and output voltage detector 312 in order to selectively pump up the voltage apparent at the output terminal.

Each one of the plurality of charge pumps 332~33n has a different pumping capacity. Thus, the voltage apparent at the output terminal VDD may be accurately maintained at the defined level of the retention voltage Vret by regulated operation of the plurality of charge pumps 332~33n by the charge pump control signals.

Here again, when power controller 311 receives an externally provided command CMD indicating entry into the data retention mode external, switch 331 of data retention circuit 330 is turned ON to equalize the voltage apparent at the output terminal VVDD with the external power VDD. Then, power controller 311 applies the second control signal CTR_2 to power gating circuit 320, interrupting the application of external power VDD to logic block 500. Thereafter, the voltage apparent at output terminal VVDD will decrease from VDD levels according to the leakage current Ileak flowing to logic block 500. Controller 310 selectively enables the plurality of charge pumps 332~33n by comparing the actual voltage detected at the output terminal VVDD by output voltage detector 312 with the retention voltage Vret indicated by retention voltage decider 314.

Figure 4:
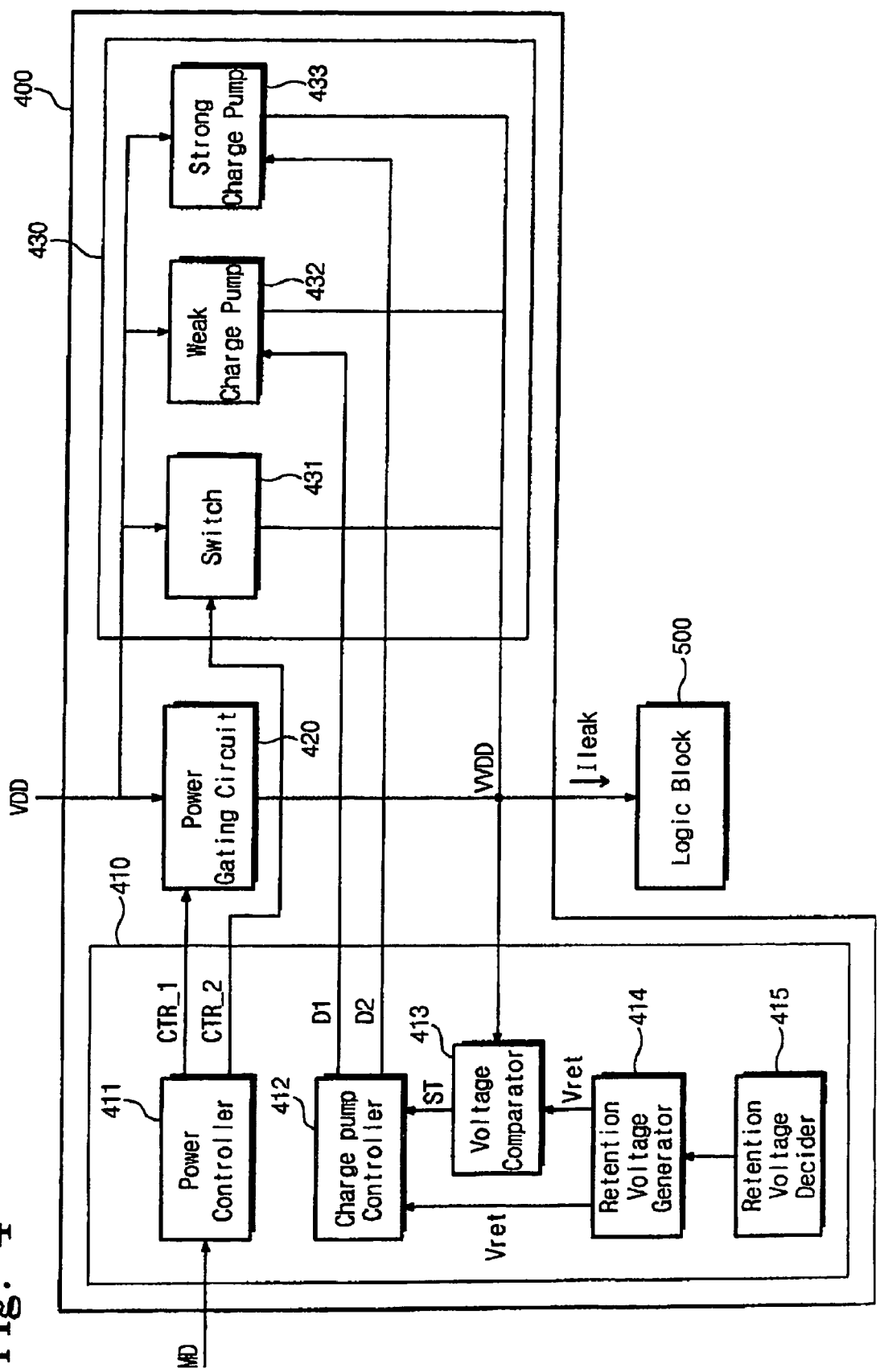
FIG. 4 is a block diagram of a power control circuit for use within a semiconductor IC according to another embodiment of the invention.

FIG. 4 is a block diagram of a power control circuit according to another embodiment of the invention.

Referring to FIG. 4, power control circuit 400 comprises controller 410, a power gating circuit 420, and a data retention circuit 430. Controller 410 comprises a power controller 411, a retention voltage decider 415, a retention voltage generator 414, a charge pump controller 412, and a voltage comparator 413.

Data retention circuit 430 comprises a switch 431, a "weak" charge pump 432 and "strong" charge pump 433 having different pumping capacity.

Power controller 411 operates to control power gating circuit 420 in response to an externally provided command CMD. Power gating circuit 420 supplies or interrupts the external power VDD to logic block 500 in response to the first control signal CTR_1 provided from power controller 411. Data retention circuit 430 fixes the voltage apparent at the output terminal VVDD to the retention voltage Vret to ensure retention of data stored in logic block 500.

Retention voltage decider 415 operates like retention voltage decider 216 described above. Retention voltage generator 414 operates to generate the retention voltage Vret in response to a signal provided from retention voltage decider 415.

Charge pump controller 412 operates to control the weak and strong charge pumps 432 and 433 in response to the retention voltage Vret provided from retention voltage generator 414. Operations of the dual (weak/strong) charge pumps will be detailed in some additional detail hereafter in conjunction with the chart shown in FIG. 5.

Voltage comparator 413 functions to compare the retention voltage Vret with the voltage apparent at output terminals VVDD. If the voltage apparent at the output terminal VVDD is higher than retention voltage Vret, a stop signal ST is applied to charge pump controller 412 by voltage comparator 413.

When power controller 411 receives an externally provided command CMD indicating entry into the data retention mode, switch 431 of data retention circuit 430 is turned ON to equalize the voltage apparent at the output terminal VVDD with the external power VDD. Then, power controller 411 applies the first control signal CTR_1 to power gating circuit 420 in order to interrupt the application of external power VDD to logic block 500. Thereafter, the voltage apparent at the output terminal VVDD will decreases from VDD levels according to the leakage current Ileak flowing towards logic block 500. Controller 410 selectively enables the dual charge pumps 432 and 433 to maintain the voltage apparent at the output terminal VVDD at the retention voltage Vret. Charge pump controller 412 stops operation of the dual charge pumps 432 and 433 when the voltage apparent at the output terminal VVDD reaches the retention voltage Vret.

FIG. 5 is a table summarizing the operational states of the dual charge pumps shown in FIG. 4.

In this embodiment, the dual charge pumps 432 and 433 are assumed to be implemented from a design using PMOS transistors. However, other charge pumps designs are susceptible to incorporation within embodiments of the invention. Dual charge pump control signals D1 and D2 provided by charge pump controller 412 are applied to the respective control gates of the respective PMOS-enabled charge pump circuits. Thus, if a low voltage (or logical "0") is applied by first charge pump control signal D1, weak charge pump 432 having a relatively lower pumping capacity is enabled. If a low voltage is applied by the second charge pump control signal D2, strong charge pump 433 having a relatively greater pumping capacity is enabled.

If a voltage of the output terminal VVDD is much lower than the retention voltage Vret, the charge pump controller 412 applies a low voltage to the outputs D1 and D2. In this case, the weak and strong charge pumps, 432 and 433, are all activated. Thus, a voltage of the output terminal VVDD is able to reach the retention voltage Vret in a very short time.

If the actual voltage detected at output terminal VVDD is slightly lower than the retention voltage Vret, charge pump controller 412 applies only the first charge pump control signal D1, enabling only weak charge pump 432. This results in a relatively slow increase in the voltage apparent at the output terminal VVDD.

If, however, the actual voltage detected at the output terminal VVDD is substantially lower than the retention voltage Vret, charge pump controller 412 applies both the first and second charge pump control signals, enabling both strong charge pump 433 and weak charge pump 432. Under the influence of both charge pumps, the voltage apparent at the output terminal VVDD rapidly rises.

Intermediate deficiencies on the voltage apparent at the output terminal VVDD may be dealt with by application of only the strong charge pump 433.

Once the voltage apparent at the output terminal VVDD reaches the retention voltage Vret, voltage comparator 413 applies the stop signal ST to charge pump controller 412, and charge pump controller 412 adjusts its control signal output to disable any active charge pump. Active control of the dual charge pumps ensures that the voltage apparent at the output terminal VVDD is at least the retention voltage without wasting any unnecessarily applied power.

Each of the foregoing embodiments is able to maintain an appropriate voltage level at the output terminal VVDD in relation to an intelligently defined retention voltage Vret. Current leakage affecting the critical minimal voltage applied from power control circuit to the corresponding logic block may be effectively accounted for and compensated in a flexible manner using accurate feedback indications.

As described above, it is possible to reduce unnecessary power consumption, preventing degradation of system performance due to a requirement for data backup and recovery operation by supplying the least a minimal voltage capable of retaining stored data within the logic block.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the invention is to be determined by the broadest permissible interpretation of the following claims and their equivalents, and shall not be restricted or limited to only the foregoing detailed description.

What is claimed is:

1. A power control circuit providing power to an output terminal supplying a logic block within a semiconductor integrated circuit, and comprising:
   a power gating circuit providing a main power voltage to the output terminal during a normal operating mode and providing a retention voltage to the output terminal during a data retention mode characterized by the absence of the main power voltage from the logic block, wherein the retention voltage is minimally sufficient to retain data stored in the logic block during the data retention mode;
   a data retention circuit generating the retention voltage and applying the retention voltage to the output terminal; and
   a controller responsive to an externally provided command to control operation of the power gating circuit and the data retention circuit,
   wherein the controller generates a first control signal applied to the power gating circuit and a second control signal applied to the data retention circuit, such that in response to the first control signal the power gating circuit passes an externally provided main power voltage to the output terminal during the normal operating mode, and in response to the second control signal the data retention circuit generates and provides the retention voltage to the output terminal during the data retention mode.

2. The power control circuit of claim 1, wherein either the normal operating mode or the data retention mode is indicated by the command received by the controller.

3. The power control circuit of claim 2, wherein
   the data retention circuit comprises a switch responsive to the second control signal and the main power voltage, and a charge pump response to a charge pump control signal and the main power voltage to pump up a voltage apparent at the output terminal; and
   the controller comprises:
      a power controller receiving the command and generating the first and second control signals;
      a retention voltage generator generating the retention voltage;
      a first oscillator receiving the retention voltage and generating a corresponding reference frequency;
      a second oscillator receiving an actual voltage apparent at the output terminal and generating a corresponding output frequency; and
      a frequency comparator receiving the reference frequency and the output frequency and generating the charge pump control signal in relation to the comparison.

4. The power control circuit of claim 3, wherein the controller further comprises;
   a retention voltage decider comprising flip-flops having a similar design to flip-flops within the logic block and generating an indication of the retention voltage, wherein the retention voltage generator is response to the indication of the retention voltage to generate the retention voltage.

5. The power control circuit of claim 3, wherein upon receiving a command indicating entry into the data retention mode, the power controller generates the second control signal, such that switch is turned ON to equalize the voltage apparent at the output terminal with the main power voltage.

6. The power control circuit of claim 2, wherein
   the data retention circuit comprises a switch responsive to the second control signal and the main power voltage, and a plurality of charge pumps respectively response to a corresponding plurality of charge pump control signals and the main power voltage to pump up a voltage apparent at the output terminal; and
   the controller comprises:
      a power controller receiving the command and generating the first and second control signals;
      a retention voltage decider generating an indication signal associated with the retention voltage;
      an output voltage detector generating an indication signal associated with the voltage apparent at the output terminal; and
      a charge pump controller responsive to the indication signals received from the retention voltage decider and the retention voltage and generating the plurality of charge pump control signals.

7. The power control circuit of claim 6, wherein the retention voltage decider comprises flip-flops having a similar design to flip-flops within the logic block and the indication signal associated with the retention voltage is generated in relation to a voltage response of the flip-flops.

8. The power control circuit of claim 6, wherein upon receiving a command indicating entry into the data retention mode, the power controller generates the second control signal, such that switch is turned ON to equalize the voltage apparent at the output terminal with the main power voltage.

9. The power control circuit of claim 2, wherein
the data retention circuit comprises a switch responsive to the second control signal and the main power voltage, and dual weak/strong charge pumps respectively response to first and second charge pump control signals and the main power voltage to pump up a voltage apparent at the output terminal; and
the controller comprises:
a power controller receiving the command and generating the first and second control signals;
a retention voltage decider generating an indication signal associated with the retention voltage;
a retention voltage generator responsive to the indication signal associated with the retention voltage to generate the retention voltage;
a voltage comparator comparing the retention voltage and the voltage apparent at the output terminal to generate a stop signal;
a charge pump controller responsive to the retention voltage and the stop signal to generate the first and second charge pump control signals.

10. A method of operating a power control circuit providing power to an output terminal supplying a logic block within a semiconductor integrated circuit, the method comprising:
in response to a received command, either providing a main rower voltage to the output terminal during a normal operating mode or providing a retention voltage to the output terminal during a data retention mode characterized by the absence of the main power voltage from the logic block, wherein the retention voltage is minimally sufficient to retain data stored in the logic block during the data retention mode,
wherein either providing a main rower voltage to the output terminal during a normal operating mode or providing a retention voltage to the output terminal during a data retention mode comprises:
generating first or second control signals in a controller in response to the received command;
applying the first control signal to the power gating circuit or applying the second control signal to the data retention circuit; and
either passing the main power voltage to the output terminal during the normal operating mode in response to the first control signal in a rower gating circuit, or generating the retention voltage and providing the generated retention voltage to the output terminal during the data retention mode in response to the second control signal in a data retention circuit.

11. The method of claim 10, wherein generating the retention voltage comprises:
generating the retention voltage and further generating a reference frequency in relation to the retention voltage;
generating an output frequency in relation to a voltage apparent at the output terminal and comparing the output frequency to the reference frequency to generate a charge pump control signal; and
applying the charge pump control signal to a charge pump connected to the output terminal.

12. The method of claim 10, wherein generating the retention voltage comprises:
generating a first indication signal associated with the retention voltage and a second indication signal associated with a voltage apparent at the output terminal;
generating a plurality of charge pump control signals in response to the first and second indication signals; and
respectively applying the plurality of charge pump control signals to a plurality of charge pumps connected to the output terminal.

13. The method of claim 10, wherein generating the retention voltage comprises:
generating the retention voltage;
generating a stop signal in relation to the retention voltage and a voltage apparent at the output terminal;
generating first and second charge pump control signals in relation to the retention voltage and the stop signal; and
respectively applying the first and second charge pump control signals to dual weak/strong charge pumps connected to the output terminal.

* * * * *